United States Patent
Haemmerli et al.

(10) Patent No.: US 10,983,479 B2
(45) Date of Patent: Apr. 20, 2021

(54) PIEZOELECTRIC ELEMENT FOR AN AUTOMATIC FREQUENCY CONTROL CIRCUIT, OSCILLATING MECHANICAL SYSTEM AND DEVICE COMPRISING THE SAME, AND METHOD FOR MANUFACTURING THE PIEZOELECTRIC ELEMENT

(71) Applicant: The Swatch Group Research and Development Ltd, Marin (CH)

(72) Inventors: Alexandre Haemmerli, Neuchatel (CH); Francois Gueissaz, Cormondreche (CH); Lionel Tombez, Bevaix (CH); Bernhard Schnyder, Leuzigen (CH); Silvio Dalla Piazza, St-Imier (CH)

(73) Assignee: The Swatch Group Research and Development Ltd, Marin (CH)

( * ) Notice: Subject to any disclaimer, the term of this patent is extended or adjusted under 35 U.S.C. 154(b) by 407 days.

(21) Appl. No.: 16/104,212

(22) Filed: Aug. 17, 2018

(65) Prior Publication Data
US 2019/0079453 A1    Mar. 14, 2019

(30) Foreign Application Priority Data
Sep. 14, 2017   (EP) .................................... 17191148

(51) Int. Cl.
*G04B 17/06*   (2006.01)
*G04C 3/04*    (2006.01)
(Continued)

(52) U.S. Cl.
CPC ......... *G04B 17/063* (2013.01); *G04B 17/066* (2013.01); *G04C 3/047* (2013.01);
(Continued)

(58) Field of Classification Search
CPC ........................... G04B 17/063; G04B 17/066
See application file for complete search history.

(56) References Cited

U.S. PATENT DOCUMENTS 3,781,955 A * 1/1974 Lavrinenko ............ H03H 9/545
                                                    29/25.35
4,435,667 A * 3/1984 Kolm ....................... G01H 1/10
                                                    310/330
(Continued)

FOREIGN PATENT DOCUMENTS

CH       705 679 A2     4/2013
CH       710 603 A2     7/2016

OTHER PUBLICATIONS

European Search Report dated Mar. 8, 2018 in European Application 17191148.0, filed on Sep. 14, 2017 (with English Translation of Categories of cited documents & Written Opinion).

*Primary Examiner* — Edwin A. Leon
*Assistant Examiner* — Jason M Collins
(74) *Attorney, Agent, or Firm* — Oblon, McClelland, Maier & Neustadt, L.L.P.

(57) ABSTRACT

A piezoelectric element for an automatic frequency control circuit, the element including: a balance spring formed of a strip of piezoelectric material; at least a first electrode, configured to be connected to the circuit and being disposed on all or part of one side of the strip; at least a second electrode configured to be connected to the circuit and being disposed on all or part of another one side of the strip distinct from the one side on which the first electrode is disposed, the piezoelectric material being a piezoelectric crystal or a piezoelectric ceramic; and at least two discontinuous layers of an insulating material, each discontinuous layer being disposed on at least one side of the strip and separating the first electrode from the second electrode, the layers of insulating material being distributed on predetermined por- (Continued)

tions of the balance spring substantially forming arcs in a predetermined angular periodicity.

20 Claims, 4 Drawing Sheets

(51) Int. Cl.
| | | |
|---|---|---|
| *H01L 41/04* | (2006.01) | |
| *H01L 41/047* | (2006.01) | |
| *H01L 41/335* | (2013.01) | |
| *H01L 41/18* | (2006.01) | |
| *H01L 41/23* | (2013.01) | |
| *H01L 41/29* | (2013.01) | |
| *H01L 41/332* | (2013.01) | |
| *H01L 41/053* | (2006.01) | |

(52) U.S. Cl.
CPC ........ *H01L 41/042* (2013.01); *H01L 41/0475* (2013.01); *H01L 41/0533* (2013.01); *H01L 41/18* (2013.01); *H01L 41/23* (2013.01); *H01L 41/29* (2013.01); *H01L 41/332* (2013.01); *H01L 41/335* (2013.01)

(56) References Cited

U.S. PATENT DOCUMENTS

| | | | |
|---|---|---|---|
| 6,671,380 B2* | 12/2003 | Chang | H04R 17/00 |
| | | | 310/367 |
| 8,721,169 B2 | 5/2014 | Schafroth | |
| 9,188,957 B2* | 11/2015 | Willemin | G04C 3/042 |
| 2013/0051191 A1 | 2/2013 | Schafroth | |
| 2013/0107677 A1 | 5/2013 | Willemin et al. | |
| 2014/0078870 A1* | 3/2014 | Kobayashi | H01L 41/09 |
| | | | 368/47 |
| 2015/0036346 A1* | 2/2015 | Hessler | B81C 1/00595 |
| | | | 362/259 |
| 2015/0234356 A1* | 8/2015 | Hessler | G04B 17/26 |
| | | | 368/200 |

\* cited by examiner

PIEZOELECTRIC ELEMENT FOR AN AUTOMATIC FREQUENCY CONTROL CIRCUIT, OSCILLATING MECHANICAL SYSTEM AND DEVICE COMPRISING THE SAME, AND METHOD FOR MANUFACTURING THE PIEZOELECTRIC ELEMENT

This application claims priority from European Patent Application No. 17191148.0 filed on Sep. 14, 2017, the entire disclosure of which is hereby incorporated herein by reference.

FIELD OF THE INVENTION

The invention concerns a piezoelectric element for an automatic frequency control circuit.

The invention also concerns an oscillating mechanical system comprising the piezoelectric element and a balance.

The invention also concerns a device comprising the oscillating mechanical system and a circuit for automatic control of the oscillation frequency of the oscillating mechanical system.

The invention also concerns a method for manufacturing the piezoelectric element.

BACKGROUND OF THE INVENTION

Piezoelectric elements are commonly used in the field of electromechanical systems, for example for making oscillators used as time bases, or for applications for mass, force, gyroscope sensors and many others.

In the field of horology, and particularly of mechanical or electromechanical watches, it is known to provide an oscillating mechanical system with a piezoelectric element. The oscillating mechanical system may typically comprise a balance, on which is mounted a balance spring, one end of which is secured to the rotating balance staff and the other end of which is secured to a fixed element of a bottom plate. The oscillation of the mechanical system is maintained via an energy source which is generally mechanical. This energy source may be, for example, a barrel driving a gear train with an escape wheel cooperating with a pallet lever. This rotating pallet lever for example actuates a pin secured in proximity to the rotating balance staff. The balance with the balance spring may thus form a regulating member of a timepiece movement. This oscillating regulating member determines the driving speed of the gear train with the escape wheel leading to the time indicator hands. The piezoelectric element may include the balance spring, on which it is known to deposit films of a (PZT type) piezoelectric material, for example on the internal and external surfaces of the spring. In this regard, JP Patent Application No 2002-228774 or EP Patent Application No 2 590 035 A1 can be mentioned. However, depositing such piezoelectric films over the entire length of the balance spring introduces an expensive extra step into the manufacture of the spring, which is a drawback.

In these two Patent Applications, control of the oscillation frequency of the balance combined with the piezoelectric balance spring is achieved by means of an automatic frequency control circuit. The electronic circuit may be powered directly by the alternating voltage generated by the piezoelectric element, which has been rectified and stored across a capacitor. To control the oscillation frequency, a comparison is made between a signal at a reference frequency provided by an oscillator stage and the alternating signal from the generator. On the basis of this comparison, a frequency adaptation signal is generated which, once applied to the piezoelectric element, allows a compressive or extension force to be generated on the element in order to brake or accelerate the oscillation of the oscillating mechanical system.

Another example of a device comprising an oscillating mechanical system provided with a piezoelectric element, and a circuit for automatic control of the oscillation frequency of the oscillating mechanical system is provided by WO Patent Application No 2011/131784 A1. According to a particular example embodiment of this device, the piezoelectric element includes a balance spring formed of a strip of piezoelectric material, a first electrode disposed on an inner side of the spring, and a second electrode disposed on an outer side of the spring. The electrodes are connected to the automatic frequency control circuit. However, one drawback of the proposed piezoelectric element is that the piezoelectric effect of the element cannot be used in a precise and optimum manner without considerably complicating the design of the system.

SUMMARY OF THE INVENTION

It is therefore an object of the invention to provide a piezoelectric element for an automatic frequency control circuit, which is simple to realize and allows the piezoelectric effect to be used in a precise and optimum manner, in order to precisely control the oscillation frequency of the oscillating mechanical system, and to overcome the aforementioned drawbacks of the state of the art.

To this end, the invention concerns a piezoelectric element for an automatic frequency control circuit, the piezoelectric element comprising:
  a balance spring formed of a strip of piezoelectric material;
  at least a first electrode, intended to be connected to the automatic frequency control circuit, and disposed on all or part of one side of the strip of piezoelectric material;
  at least a second electrode intended to be connected to the automatic frequency control circuit, and disposed on all or part of one side of the strip of piezoelectric material, distinct from the side carrying the first electrode;
  wherein the piezoelectric material is a piezoelectric crystal or a piezoelectric ceramic, and
  wherein the piezoelectric element further comprises at least two discontinuous layers of an insulating material, each discontinuous layer of insulating material being disposed on at least one side of the strip of piezoelectric material and separating a first electrode from a second electrode, the discontinuous layers of insulating material being distributed on predetermined portions of the balance spring substantially forming arcs, in a predetermined angular periodicity.

Using a piezoelectric crystal for the balance spring makes it possible to make the piezoelectric element in a simple and economical manner, while maintaining good piezoelectric performance. Further, the particular arrangement of discontinuous layers of insulating material separating a first electrode from a second electrode, with a predetermined angular periodicity on the balance spring, allows the electrodes to collect part of the electrical charges generated by a mechanical stress, overcoming the problem of the change in polarity of the charges due to the change in crystal orientation of the piezoelectric crystal. This change in polarity of the charges occurs with periodic angular distribution in the balance spring. Indeed, the crystalline structure of the piezoelectric material induces a dependence of the piezoelectric coefficient on the orientation of the mechanical stress in a horizontal plane XY. In other words, depending on the direction of the stress in plane XY, the electrical charges created may be positive or negative, and their value comprised between a zero value and a maximum value, as illustrated, for example, in FIG. 2 in the case of quartz. As a result of the piezoelectric element according to the invention, the problem of positive and negative charges cancelling each other in each of the electrodes is overcome. This is made possible by the decoupling of the electrodes effected by the discontinuous layers of insulating material, which allows each electrode to collect charges of only one polarity. Further, due to their particularly simple geometry, design and manufacture of the electrodes is easy. In a non-limiting manner within the scope of the present invention, the piezoelectric crystal is, for example, a single quartz crystal.

Advantageously, the piezoelectric element includes a first groove made in a first side of the strip of piezoelectric material, and a second groove made in a second side of the strip of piezoelectric material. The first electrode is disposed in the first groove, and the second electrode is disposed in the second groove. This makes it possible to increase the capacitive coupling between the electrodes, and thereby increase the piezoelectric performance of the element.

To this end, the invention also concerns an oscillating mechanical system for an automatic frequency control circuit, comprising a balance and a piezoelectric element, the piezoelectric element comprising:
  a balance spring formed of a strip of piezoelectric material;
  at least a first electrode, intended to be connected to the automatic frequency control circuit, and disposed on all or part of one side of the strip of piezoelectric material;
  at least a second electrode intended to be connected to the automatic frequency control circuit, and disposed on all or part of one side of the strip of piezoelectric material, distinct from the side carrying the first electrode;
  wherein the piezoelectric material is a piezoelectric crystal or a piezoelectric ceramic, and
  wherein the piezoelectric element further comprises at least two discontinuous layers of an insulating material, each discontinuous layer of insulating material being disposed on at least one side of the strip of piezoelectric material and separating a first electrode from a second electrode, the discontinuous layers of insulating material being distributed on predetermined portions of the balance spring substantially forming arcs, in a predetermined angular periodicity.

To this end, the invention also concerns a device comprising the oscillating mechanical system and a circuit for automatic control of the oscillation frequency of the oscillating mechanical system, said automatic control circuit including an oscillator stage able to provide a reference signal, means for comparing the frequency of two signals, and a frequency adaptation unit connected to the piezoelectric element of the oscillating mechanical system and able to provide a frequency adaptation signal, wherein the piezoelectric element of the oscillating mechanical system is able to generate an alternating voltage at a frequency matching the oscillating mechanical system, the first and second electrodes of the piezoelectric element being connected to the automatic control circuit in order to receive from the frequency adaptation unit the frequency adaptation signal, based on the result of a frequency comparison, in the frequency comparison means, between the alternating signal and the reference signal.

Specific embodiments of the device are defined in claims 15 and 16.

To this end, the invention also concerns a method for manufacturing the piezoelectric element wherein the method includes the steps consisting in:
  machining a strip of piezoelectric material, such as a piezoelectric crystal or a piezoelectric ceramic from a crystal or piezoelectric ceramic plate,
  placing a first electrode on all or part of a first side of the strip of piezoelectric material,
  placing a second electrode on all or part of a second side of the strip of piezoelectric material,
  placing, on at least two faces of the strip of piezoelectric material, at least two discontinuous layers of an insulating material, so that each discontinuous layer of insulating material separates a first electrode from a second electrode, and so that the discontinuous layers of insulating material are distributed over predetermined portions of the strip of piezoelectric material,
  winding the strip of piezoelectric material into the shape of a balance spring, the discontinuous layers of insulating material being distributed over predetermined portions of the strip of piezoelectric material, so as to form substantially arcs on the balance spring, with a predetermined angular periodicity.

A particular embodiment of the method is defined in claim 18.

BRIEF DESCRIPTION OF THE DRAWINGS

The objects, advantages and features of the piezoelectric element for an automatic frequency control circuit, of the oscillating mechanical system and of the device comprising the same, and of the method for manufacturing the element, will appear more clearly in the following description, based on at least one non-limiting embodiment illustrated by the drawings, in which.

DETAILED DESCRIPTION OF THE INVENTION

In the following description, reference is made to a piezoelectric element for an automatic frequency control circuit, particularly a circuit for automatic control of the oscillation frequency of an oscillating mechanical system. All the electronic components of the automatic frequency control circuit that are well known to those skilled in the art in this technical field will be described only in a simplified manner. As described below, the automatic control circuit is mainly used for controlling the oscillation frequency of a balance on which is mounted the balance spring of the piezoelectric element. However, other oscillating mechanical systems may also be envisaged, but in the following description, reference will be made only to an oscillating mechanical system in the form of a balance on which is mounted the balance spring of the piezoelectric element.

Figure 1:
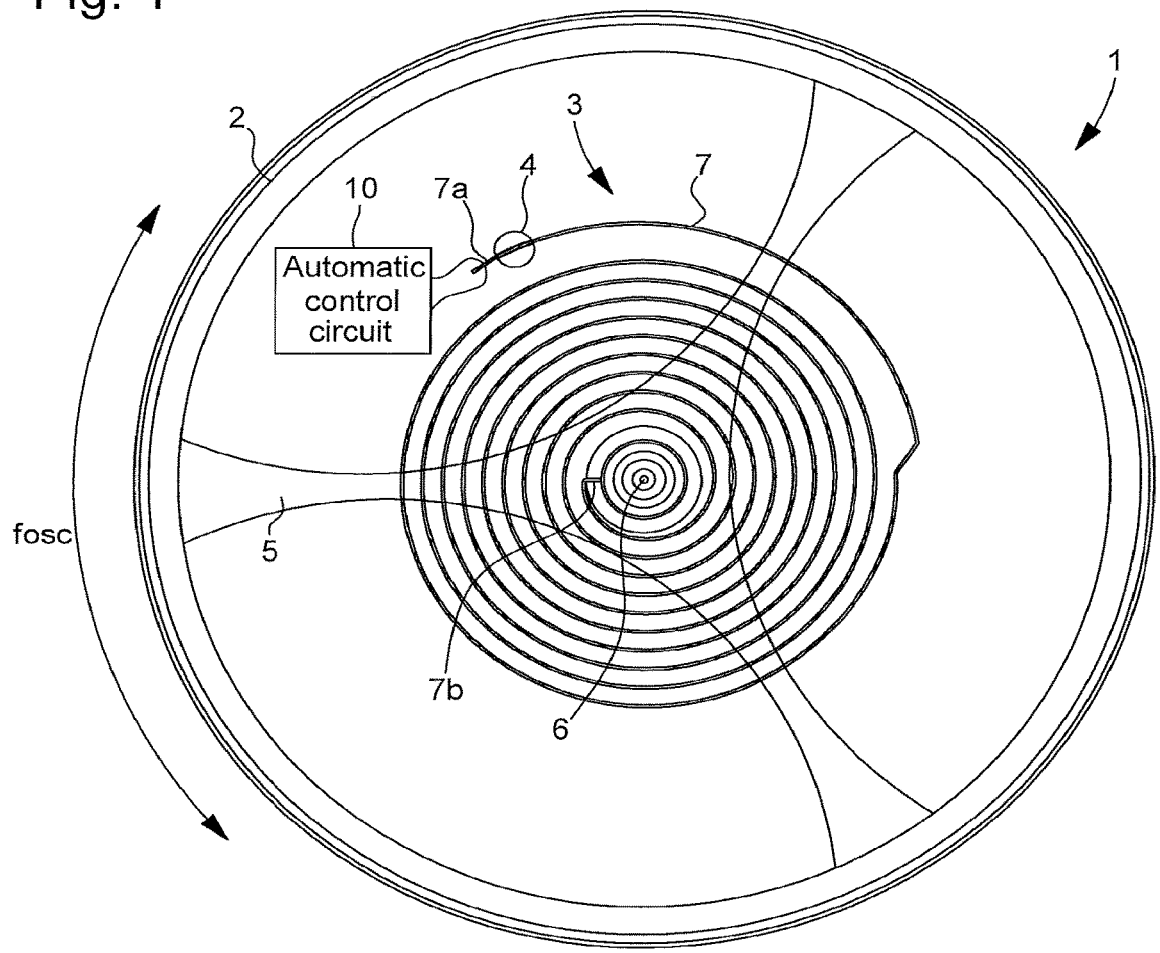
FIG. 1 shows a simplified view of a device, which includes an oscillating mechanical system provided with a piezoelectric element according to the invention, and a circuit for automatic control of the oscillation frequency of the oscillating mechanical system.
Figure 4:
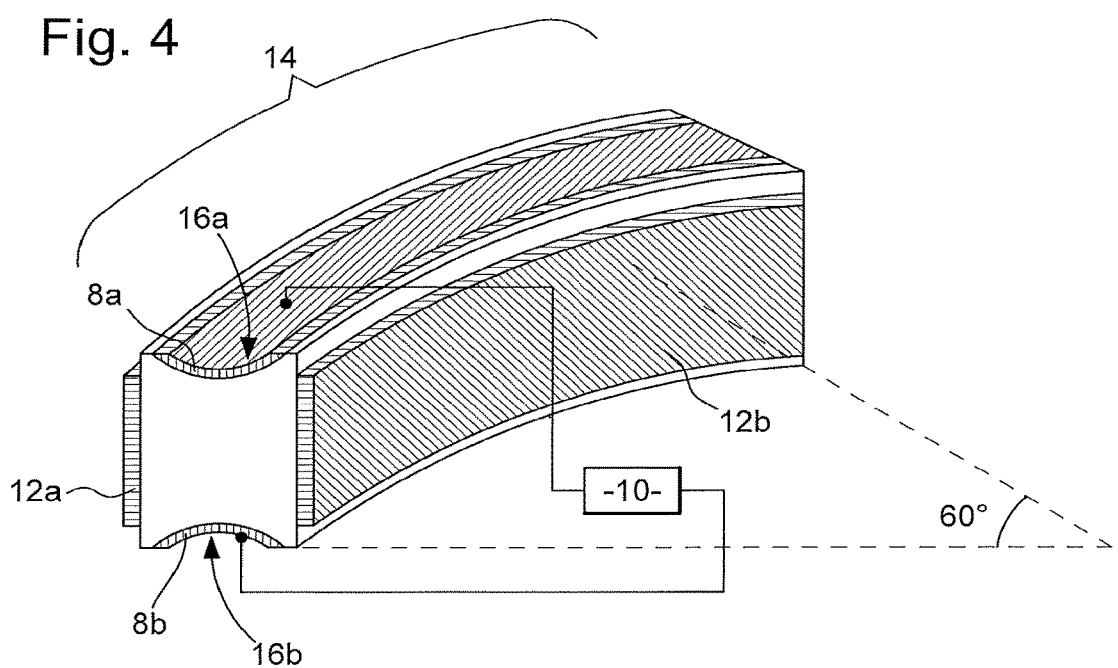
FIG. 4 represents a portion of a balance spring of the piezoelectric element of FIG. 3, according to a first embodiment.
Figure 5:
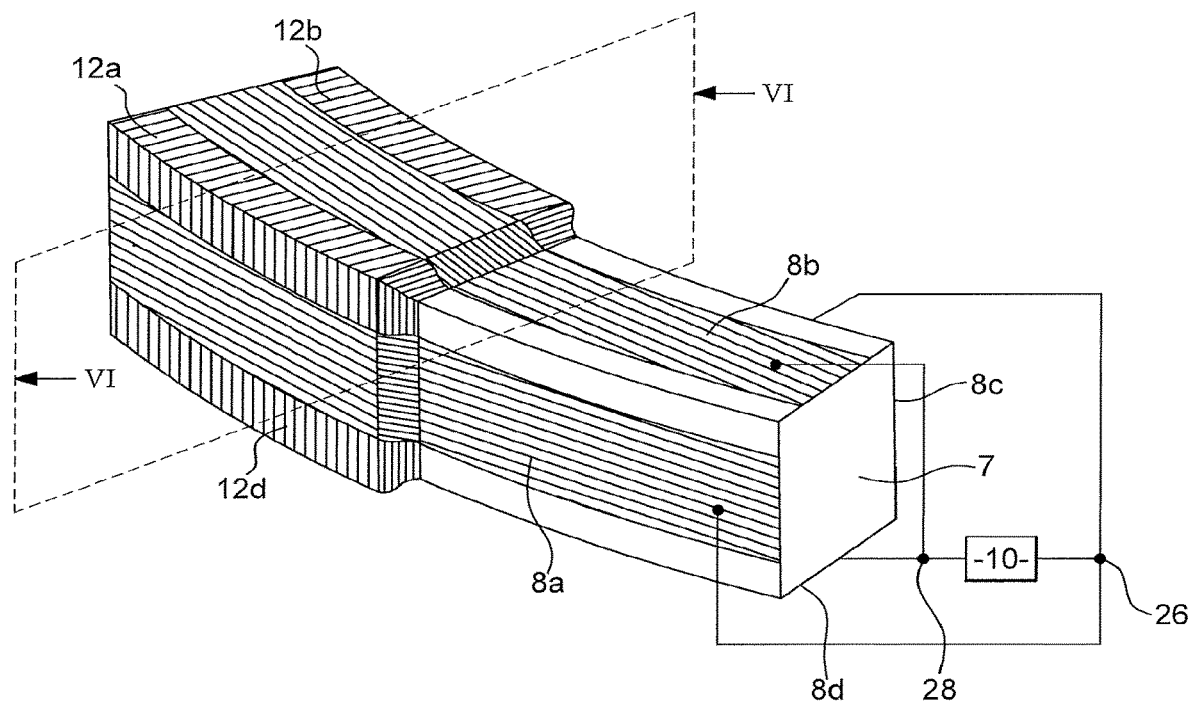
FIG. 5 represents a portion of a balance spring of the piezoelectric element of FIG. 3, according to a second embodiment.
Figure 6:
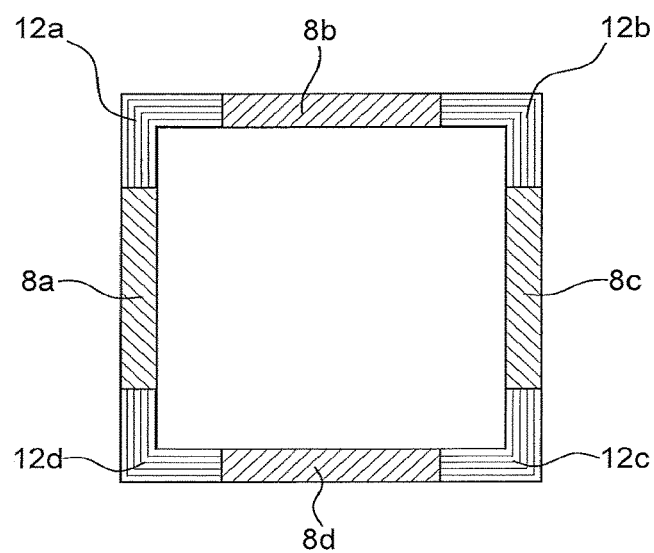
FIG. 6 is a cross-sectional view of the piezoelectric element of FIG. 5, taken along a cross-sectional plane VI-VI.

FIG. 1 shows a device 1, which includes an oscillating mechanical system 2, 3 and a circuit 10 for automatic control of the oscillation frequency fosc of the oscillating mechanical system. In a mechanical watch, the oscillating mechanical system may include a balance 2, which is formed of a metal ring connected, for example, by three arms 5 to a rotating staff 6, and a piezoelectric element 3, which includes a balance spring 7. As represented in FIGS. 4 to 6, piezoelectric element 3 further includes at least two electrodes 8a-8d and at least two discontinuous layers 12 of insulating material. Electrodes 8a-8d are electrically connected to automatic frequency control circuit 10. Returning to FIG. 1, a first end 7a of balance spring 7 is fixedly held by a balance spring stud 4 of a balance cock (not shown). This balance cock is secured to a bottom plate (not shown) of the watch movement. A second end 7b of balance spring 7 is directly secured to the rotating staff 6 of balance 2.

The oscillation of balance 2 with its balance spring 7 is maintained via an energy source (not shown), which may be electric, but is preferably mechanical. This mechanical energy source may be a barrel, which conventionally drives a gear train with an escape wheel cooperating with a pallet lever. This rotating pallet lever for example actuates a pin secured in proximity to the rotating balance staff. The balance with the balance spring may thus form a regulating member of a timepiece movement.

Balance spring 7 is realized by means of a strip of piezoelectric material of thickness generally less than 0.25 mm, for example on the order of 0.1 to 0.2 mm. The piezoelectric material may be a piezoelectric crystal or a PZT piezoelectric ceramic. Preferably, the piezoelectric crystal is a single crystal, typically single crystal quartz, in the example embodiments of FIGS. 2 to 6. The strip of piezoelectric material is, for example, machined in Z-cut single crystal quartz, in other words cut perpendicularly to the main axis of a single crystal quartz bar. At least two metal electrodes are then deposited on distinct sides of the piezoelectric crystal strip, in an arrangement that will be described in more detail below. More specifically, the electrodes are placed on one portion or over the entire length of balance spring 7. Each electrode is, for example, an Au/Cr (Gold/Chromium) electrode. At least two discontinuous layers of insulating material are then deposited on at least two sides of the piezoelectric crystal strip, in an arrangement that will be described in more detail below. Each discontinuous layer of insulating material separates two electrodes of opposite polarity. The insulating material is, for example, an oxide. Finally, the piezoelectric crystal strip is wound into a spiral with the coils spaced apart from each other.

Machining of the spiral is achieved by photolithography and hydrofluoric acid etching. For this purpose, the quartz wafer is first coated with a layer of Cr then of Au, then a UV photosensitive resin. The resin is exposed through a mask containing the shape of the spiral then developed in a dedicated product. Then the gold and chromium are wet etched. Finally, the quartz is etched in a hydrofluoric acid bath. The resin is removed in a solvent and the Au/Cr mask is removed in a wet process. The electrodes can then be placed and structured.

Figure 2:
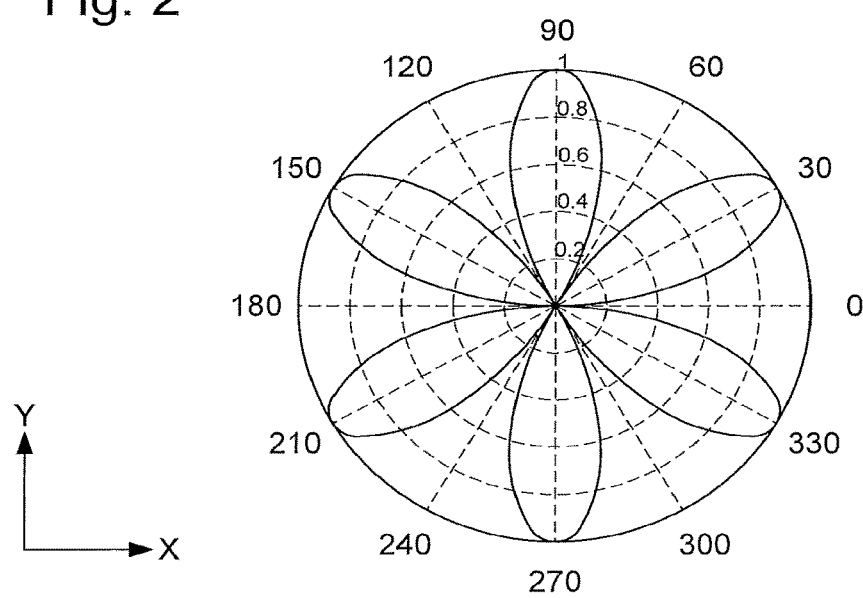
FIG. 2 represents an amplitude diagram of the piezoelectric effect of the piezoelectric element according to an example embodiment of the invention, according to the orientation of a stress in a plane XY.

FIG. 2 represents the amplitude of the piezoelectric effect of element 3 when it includes a quartz balance spring 7, according to the orientation of a stress in a horizontal plane XY. As shown by this Figure, the crystalline structure of the quartz induces a dependence of the piezoelectric coefficient on the orientation of mechanical stress in plane XY. In other words, depending on the direction of the stress in plane XY, the electrical charges created by balance spring 7 may be positive or negative, and their value comprised between a zero value and a maximum value. Since the crystalline structure of quartz is trigonal, the maximum of the electrical charges is repeated every 60°, and there is also a change in polarity of the charges every 60°.

Figure 3:
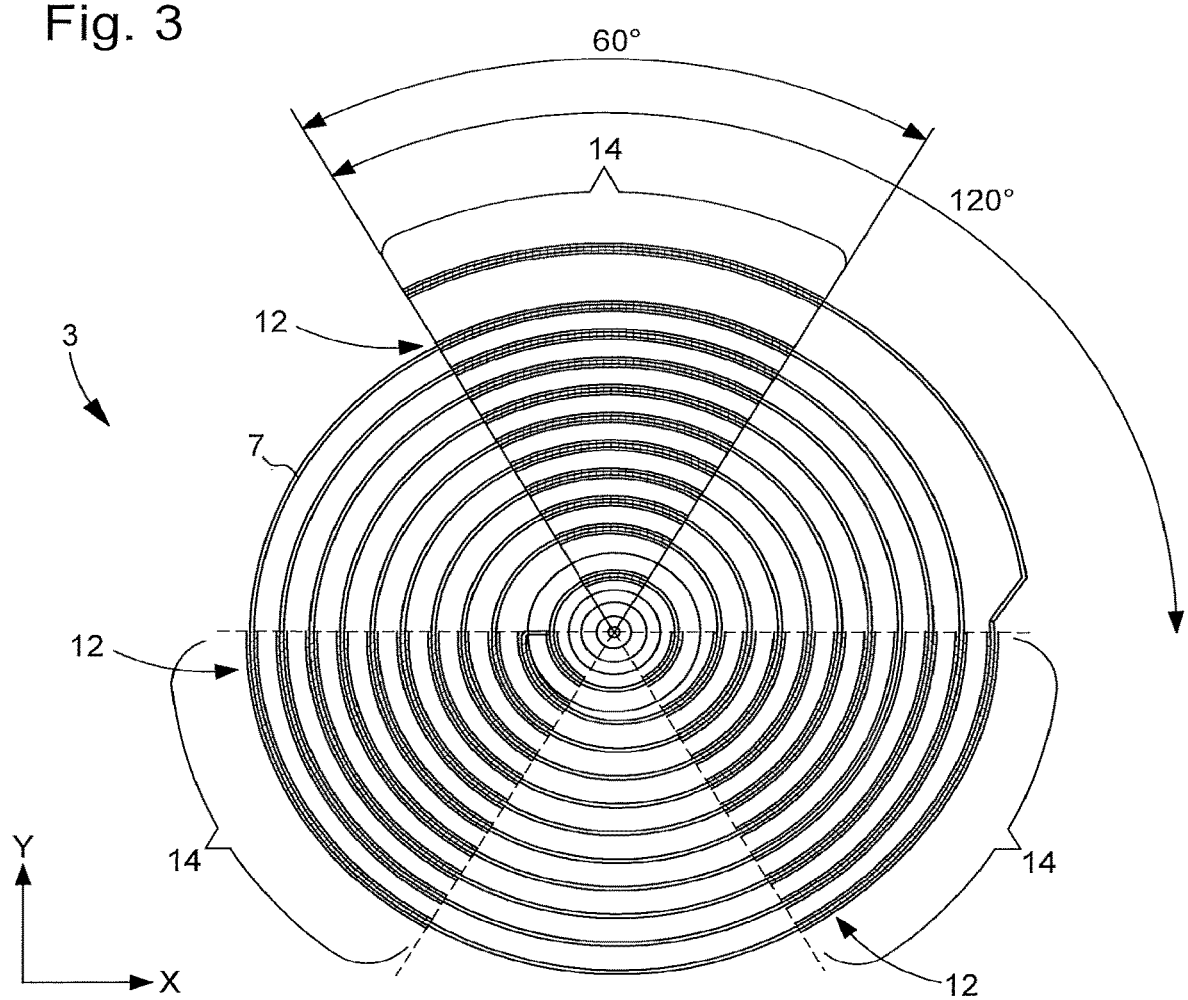
FIG. 3 represents a simplified view of an example embodiment of the piezoelectric element according to the invention.

As represented in FIG. 3, the discontinuous layers 12 of insulating material are distributed over predetermined portions 14 of balance spring 7. Predetermined portions 14 substantially form arcs on balance spring 7, with predetermined angular periodicity. In the preferred example embodiment wherein balance spring 7 is formed of a quartz strip, the predetermined angular periodicity is substantially equal to 120°. The arcs formed by discontinuous layers 12 of insulating material each define an angular sector substantially equal to 60°. In other words, according to this preferred example embodiment, over the length of balance spring 7, alternately every 60° there are portions with insulating material layers 12 and portions devoid of such layers 12. Thus, referring to FIG. 2, piezoelectric element 3 according to the invention makes it possible to avoid the mutual cancellation of electrical charges, due to the change in polarity induced by the change in crystal orientation of quartz balance spring 7. As a result of the decoupling of the electrodes achieved by the discontinuous layers of insulating material, the electrodes collect part of the electrical charges generated by a mechanical stress, thereby preventing the mutual cancellation of charges.

A first embodiment of the invention will now be described with reference to FIG. 4. According to this first embodiment, piezoelectric element 3 includes two electrodes 8a, 8b and two discontinuous layers 12a, 12b of insulating material. A first electrode 8a of the two electrodes is disposed on one side of the piezoelectric crystal strip denoted the 'upper' side. A second electrode 8b is disposed on an opposite side of the strip denoted the 'lower' side. When the piezoelectric crystal strip with electrodes 8a, 8b is wound, the lower and upper sides are perpendicular to the axis of rotation of the balance. Preferably, the two electrodes 8a, 8b extend over the entire length of balance spring 7, although only one portion 14 of the latter is represented in FIG. 4.

A first discontinuous layer 12a of insulating material of the two layers is disposed on a side of the piezoelectric crystal strip denoted the 'external' side. A second discontinuous layer 12b of insulating material is disposed on an opposite side of the strip denoted the 'inner' side. The inner side faces the axis of rotation of the balance, whereas the outer side is opposite the inner side. Each discontinuous layer 12a, 12b of insulating material separates first electrode 8a from second electrode 8b. FIG. 4 illustrates one portion 14 of balance spring 7, substantially forming an arc, on which are present the two layers 12a, 12b of insulating material. As indicated previously, in the preferred example embodiment wherein balance spring 7 is formed of a quartz strip, this arc defines an angular sector substantially equal to 60°.

Preferably, piezoelectric element 3 can include a first groove 16a made in an upper side of the piezoelectric crystal strip, and a second groove 16b made in a lower side. First electrode 8a is disposed in first groove 16a, and second electrode 8b is disposed in second groove 16b.

FIGS. 5 to 6 illustrate a second embodiment of the invention in which elements similar to the first embodiment described above are identified by the same references, and are not, therefore, described again.

In this second embodiment, in addition to first and second electrodes 8a, 8b, piezoelectric element 3 also includes a third and a fourth electrode 8c, 8d. Piezoelectric element 3 also includes four discontinuous layers 12a-12d of insulating material. As illustrated in FIG. 5, third electrode 8c, which is of the same polarity as first electrode 8a, is connected to the latter in a first connection terminal 26. Fourth electrode 8d, which is of the same polarity as second electrode 8b, is connected to the latter in a second connection terminal 28. The first and second connection terminals 26, 28 are each connected to automatic frequency control circuit 10. In a particular example embodiment, not represented in the Figures, the first and second connection terminals 26, 28 are disposed on balance spring stud 4 which fixedly holds first end 7a of balance spring 7.

The first, second, third and fourth electrodes 8a-8d are disposed on the outer, upper, inner and lower sides respectively of the piezoelectric crystal strip. Preferably, the four electrodes 8a-8d extend over the entire length of balance spring 7, although only one portion of the latter is represented in FIG. 5.

Each discontinuous layer 12a-12d of insulating material is disposed straddling two adjacent sides of the piezoelectric crystal strip. Thus, a first discontinuous layer 12a of insulating material separates first electrode 8a from second electrode 8b. A second discontinuous layer 12b of insulating material separates second electrode 8b from third electrode 8c. A third discontinuous layer 12c of insulating material separates third electrode 8c from fourth electrode 8d. Finally, a fourth discontinuous layer 12d of insulating material separates fourth electrode 8d from first electrode 8a.

Although not represented in FIGS. 5 and 6, the piezoelectric element 3 according to this second embodiment can advantageously include electrode support grooves, made in opposite sides of the piezoelectric crystal strip.

During the oscillation of balance 2 with balance spring 7, a compressive force or an extension force is alternately applied to the piezoelectric crystal strip, which together thus generate an alternating voltage. The oscillation frequency of balance 2 with balance spring 7 can typically lie, for example, between 3 and 10 Hz. Automatic control circuit 10 thus receives this alternating voltage, via the electrodes to which it is connected. The automatic control circuit can be connected to the electrodes directly or via two metal wires.

Figure 7:
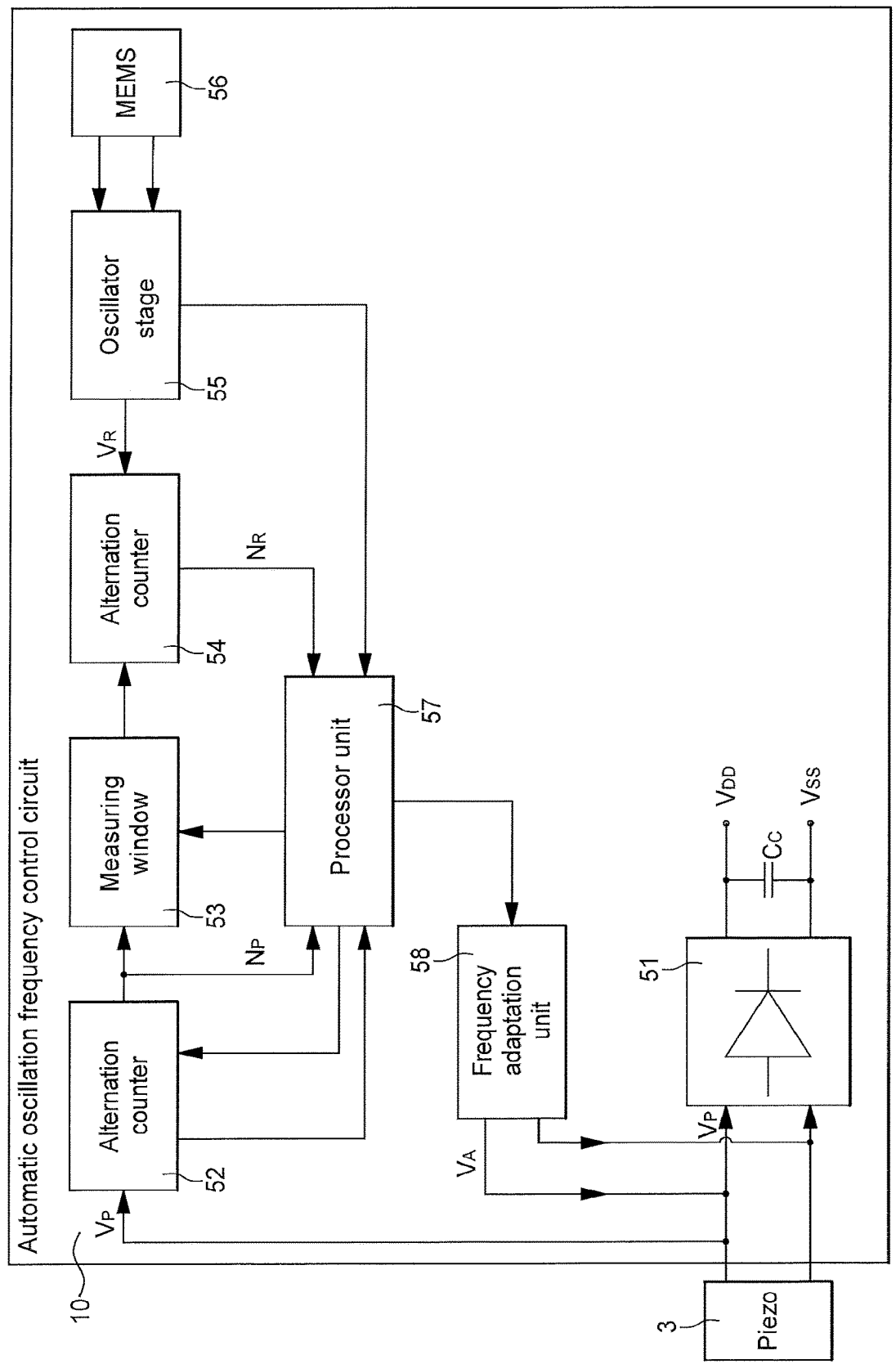
FIG. 7 represents a simplified block diagram of the electronic components of the automatic control circuit of FIG. 1, according to an example embodiment, wherein the circuit is connected to the piezoelectric element of the oscillating mechanical system.

FIG. 7 represents the various electronic elements of an example embodiment of automatic control circuit 10 for controlling the oscillation frequency of the oscillating mechanical system. Other examples of automatic frequency control circuits could be envisaged without departing from the scope of the invention.

Automatic control circuit 10 is connected to two electrodes or groups of electrodes of piezoelectric element 3. Automatic control circuit 10 is able to rectify the alternating voltage VP received from piezoelectric element 3 by means of a conventional rectifier 51. The rectified voltage of alternating voltage VP is stored across a capacitor Cc. This rectified voltage between terminals VDD and VSS of capacitor Cc may be sufficient to power all the electronic elements of the automatic control circuit without the aid of an additional voltage source, such as a battery.

Automatic control circuit 10 includes an oscillator stage 55, connected, for example, to a MEMS resonator 56. The oscillating circuit of the oscillator stage with the MEMS resonator provides an oscillating signal, which may be of a frequency lower than 500 kHz, for example on the order of 200 kHz. Thus, oscillator stage 55 can preferably provide a reference signal VR, whose frequency may be equal to the frequency of the oscillating signal of the oscillator circuit.

In order to control the oscillation frequency of the oscillating mechanical system, a comparison must be made in automatic control circuit 10 between alternating voltage VP and reference signal VR. For this purpose, automatic control circuit 10 includes comparison means 52, 53, 54, 57 for comparing the frequency of alternating voltage VP to the frequency of reference signal VR. In the case where the reference signal frequency matches the frequency of the oscillation circuit of oscillator stage 55, i.e. a frequency on the order of 200 kHz, the comparison means must be designed to take account of the large frequency deviation between alternating voltage VP and reference signal VR.

The comparison means are formed, firstly, of a first alternation counter 52, which receives as input the alternating voltage VP of the piezoelectric element, and which provides a first counting signal NP to a processor processing unit 57. The comparison means also include a second alternation counter 54, which receives as input reference signal VR, and which provides a second counting signal NR to processor processing unit 57.

To take account of the frequency deviation between alternating voltage VP and reference signal VR, there is also provided a measuring window 53, disposed between first alternation counter 52 and second alternation counter 54. This measuring window 53 determines the counting time of second alternation counter 54. Processor processing unit 57 provides configuration parameters to measuring window 53 to determine the counting time for the second alternation counter. These configuration parameters are stored in a memory (not represented) in the processor processing unit. These configuration parameters may be different depending on whether the watch is a ladies' or men's watch. The different operations processed in processor processing unit 57 can be controlled by a clock signal provided, for example, by the oscillating circuit of oscillator stage 55.

The counting time of second alternation counter 54 is adapted proportionally to the counting time of a certain determined number of alternations counted by first alternation counter 52 in first counting signal NP. Processor processing unit 57 could also control first alternation counter 52 to define the beginning and end of a counting period. However, it is also possible to envisage that the first alternation counter 52 providing information as to the start and end of a determined number of counted alternations to processor processing unit 57. If, for example, there are 200 alternations to be counted in the first alternation counter, measuring window 53 is configured such that second alternation counter 54 counts a number of alternations of reference signal VR during a duration that is approximately 5000 times shorter. This duration may also be dependent on the counting time, for example, on the 200 alternations of first alternation counter 52. This makes it possible to reduce the electrical consumption of the automatic control circuit.

The start of counting controlled by measuring window 53 can be determined by first alternation counter 52 but can also preferably be directly controlled by processor processing unit 57. Processor processing unit 57 can first receive the first counting signal NP relating to a first determined number of counted alternations of alternating voltage VP in a first time interval. This first counting signal is stored, for example, in a register of the processor processing unit. Thereafter, processing unit 57 can receive the second counting signal NR relating to a second number of counted alternations in second alternation counter 54 in a second time interval controlled by measuring window 53. This second counting signal NR can also be stored in another register of the processor processing unit. Finally, a comparison of the two counting signals is made in processor processing unit 57 to determine whether the frequency of alternating voltage VP is proportionally too high or too low with respect to the reference signal frequency.

On the basis of the comparison made between the two counting signals NP and NR in the processor processing unit, said processor processing unit controls a frequency adaptation unit 58, whose output is connected to the two electrodes or electrode groups of piezoelectric element 3. This frequency adaptation unit 58 can be arranged to provide a frequency adaptation signal, which is a continuous signal VA, whose level is a function of the difference between the two counting signals communicated by the processor processing unit. A switchable array of capacitors or resistors can be provided for this purpose. A continuous voltage value can be provided via a voltage follower from adaptation unit 58 to one of the electrodes or groups of electrodes of piezoelectric element 3 or to the other electrode or group of electrodes of the piezoelectric element. This thus allows a certain force to be generated on the piezoelectric element in order to brake or accelerate the oscillation of the oscillating mechanical system as a function of the comparison of the two counting signals.

Automatic control circuit 10 may also include well known temperature compensating elements, and a unit for reset on each activation of automatic control circuit 10. All of the electronic components of the automatic control circuit, and MEMS resonator 56 and capacitor Cc form part, for example, of the same compact electronic module. All these electronic components can advantageously be integrated in the same monolithic silicon substrate, which makes it possible to have a single self-powered electronic module for controlling the frequency of the oscillating mechanical system.

The preceding description of the piezoelectric element according to the invention was made with reference to a balance spring formed of a single crystal quartz strip. However, the quartz used as piezoelectric crystal is not limiting within the scope of the present invention, and other piezoelectric crystals may also be envisaged for forming the balance spring, such as, for example, although this list is not exhaustive, topaz, berlinite, lithium niobate, lithium tantalate, gallium phosphate, gallium arsenate, aluminium silicate, germanium dioxide, a single crystal tourmaline, a single crystal from the group of zinc blende structure III-V semiconductors, or a single crystal from the group of wurtzite structure II-VI semiconductors.

Consequently, although the description of the invention given above was made with reference to a change in polarity of the charges observing a periodic angular distribution of 60°, due to the crystalline structure of quartz, other periodic angular distributions can also be envisaged without departing from the scope of the present invention defined by the claims, depending on the different types of piezoelectric crystals used to form the balance spring.

Further, the preceding description of the piezoelectric element according to the invention was made with reference to discontinuous layers formed of an oxide as insulating material. Such an oxide may, for example, be chosen from silica, alumina or even hafnium oxide, although this list is not exhaustive. Further, the choice of an oxide as insulating material is not limiting within the scope of the present invention, and other insulating material can be envisaged, such as, for example, silicon nitride.

What is claimed is:

1. A piezoelectric element for an automatic frequency control circuit, the piezoelectric element comprising:
   a balance spring formed of a strip of piezoelectric material;
   at least a first electrode, configured to be connected to the automatic frequency control circuit, and being disposed on all or part of one side of the strip of piezoelectric material;
   at least a second electrode configured to be connected to the automatic frequency control circuit, and being disposed on all or part of another one side of the strip of piezoelectric material distinct from the one side on which the first electrode is disposed,
   wherein the piezoelectric material is a piezoelectric crystal or a piezoelectric ceramic; and
   at least two discontinuous layers of an insulating material, each discontinuous layer of insulating material being disposed on at least one side of the strip of piezoelectric material and separating the first electrode from the second electrode, the at least two discontinuous layers of insulating material being distributed on predetermined portions of the balance spring substantially forming arcs in a predetermined angular periodicity.

2. The piezoelectric element according to claim 1,
   wherein the first electrode is disposed on all or part of a first side of the strip of piezoelectric material,
   wherein the second electrode is disposed on all or part of a second side of the strip of piezoelectric material opposite to the first side,
   wherein a first discontinuous layer of insulating material is disposed on a third side of the strip of piezoelectric material, and
   wherein a second discontinuous layer of insulating material is disposed on a fourth side of the strip of piezoelectric material opposite to the third side.

3. The piezoelectric element according to claim 1,
   wherein the piezoelectric element includes two first electrodes, two second electrodes, and four discontinuous layers of insulating material,
   wherein the two first electrodes are connected in a first connection terminal configured to be connected to the automatic frequency control circuit, and are disposed on a first pair of opposite sides of the strip of piezoelectric material,
   wherein the two second electrodes are connected in a second connection terminal configured to be connected to the automatic frequency control circuit, and are disposed on a second pair of opposite sides of the strip of piezoelectric material, and
   wherein each discontinuous layer of insulating material is disposed astride on one of the sides of the first pair of sides and one of the sides of the second pair of sides of the strip of piezoelectric material.

4. The piezoelectric element according to claim 1, wherein the piezoelectric crystal is a single crystal.

5. The piezoelectric element according to claim 1, wherein the piezoelectric crystal is a single crystal chosen from the group consisting of topaz, berlinite, lithium niobate, lithium tantalate, gallium phosphate, gallium arsenate, aluminium silicate, germanium dioxide, a single crystal tourmaline, a single crystal from the group of zinc blende structure III-V semiconductors, or a single crystal from the group of wurtzite structure II-VI semiconductors.

6. The piezoelectric element according to claim 1, wherein the piezoelectric crystal is single crystal quartz.

7. The piezoelectric element according to claim 6, wherein the balance spring is machined in Z-cut single crystal quartz.

8. The piezoelectric element according to claim 6, wherein the predetermined angular periodicity is substantially equal to 120°.

9. The piezoelectric element according to claim 6, wherein the arcs each define an angular sector substantially equal to 60°.

10. The piezoelectric element according to claim 1,
wherein the piezoelectric element also includes a first groove made in a first upper side of the strip of piezoelectric material and a second groove made in a second lower side of the piezoelectric material strip, and
wherein the first electrode is disposed in the first groove, and the second electrode is disposed in the second groove.

11. The piezoelectric element according to claim 1, wherein the insulating material is an oxide.

12. The piezoelectric element according to claim 1, wherein the insulating material is chosen from the group comprising silica, alumina, hafnium oxide, and silicon nitride.

13. A method for manufacturing a piezoelectric element according to claim 1, the method including the steps of:
machining a strip of piezoelectric material, the piezoelectric material being a piezoelectric crystal or a piezoelectric ceramic, from a crystal or a piezoelectric ceramic plate;
placing a first electrode on all or part of a first side of the strip of piezoelectric material;
placing a second electrode on all or part of a second side of the strip of piezoelectric material;
placing, on at least two faces of the strip of piezoelectric material, at least two discontinuous layers of an insulating material, each discontinuous layer of insulating material separating the first electrode from the second electrode, and the at least two discontinuous layers of insulating material being distributed over predetermined portions of the strip of piezoelectric material; and
winding the strip of piezoelectric material into a shape of a balance spring, the at least two discontinuous layers of insulating material being distributed over the predetermined portions of the strip of piezoelectric material, so as to substantially form arcs on the balance spring in a predetermined angular periodicity.

14. The manufacturing method according to claim 13,
wherein the balance spring of the wound strip of piezoelectric material is machined from a single crystal plate, wherein the single crystal plate is coated with a first layer of Au/Cr and with a second layer of photosensitive resin, the first and the second layers then being exposed by photolithography,
wherein the single crystal plate is then machined by wet means using a hydrofluoric acid and using the Au/Cr layer as a mask,
wherein the photosensitive resin and the Au/Cr layer are removed,
wherein an insulating layer is deposited by cathodic sputtering or vacuum deposition, and is then structured by photolithography and wet etching, and
wherein the first and the second electrodes are deposited through a mask or structured by photolithography.

15. The manufacturing method according to claim 14, wherein the single crystal plate is a quartz plate.

16. The manufacturing method according to claim 14, wherein the insulating layer is an oxide, a nitride, a carbide, or a polymer.

17. An oscillating mechanical system for an automatic frequency control circuit, the oscillating mechanical system comprising:
a balance; and
a piezoelectric element provided with a balance spring, the balance spring being mounted on the balance and being formed of a strip of piezoelectric material, the piezoelectric element further comprising:
at least a first electrode, configured to be connected to the automatic frequency control circuit, and being disposed on all or part of one side of the strip of piezoelectric material;
at least a second electrode configured to be connected to the automatic frequency control circuit, and being disposed on all or part of another one side of the strip of piezoelectric material distinct from the one side on which the first electrode is disposed,
wherein the piezoelectric material is a piezoelectric crystal or a piezoelectric ceramic; and
at least two discontinuous layers of an insulating material, each discontinuous layer of insulating material being disposed on at least one side of the strip of piezoelectric material and separating the first electrode from the second electrode, the at least two discontinuous layers of insulating material being distributed on predetermined portions of the balance spring substantially forming arcs in a predetermined angular periodicity.

18. A device comprising the oscillating mechanical system according to claim 17 and an automatic control circuit for automatic configured to automatically control an oscillation frequency of the oscillating mechanical system, the automatic control circuit including an oscillator stage configured to provide a reference signal, means for comparing a frequency of two signals, and a frequency adaptation unit connected to the piezoelectric element of the oscillating mechanical system and being configured to provide a frequency adaptation signal,
wherein the piezoelectric element of the oscillating mechanical system is further configured to generate an alternating voltage at a frequency matching the oscillating mechanical system, the first and the second electrodes of the piezoelectric element being connected to the automatic control circuit in order to receive from the frequency adaptation unit the frequency adaptation signal, based on a result of a frequency comparison, in the frequency comparison means, between an alternating signal and the reference signal.

19. The device according to claim 18, wherein the automatic control circuit further includes a rectifier configured to rectify the alternating voltage generated by the piezoelectric element and to store the rectified voltage across at least one capacitor, in order to supply the automatic control circuit with electricity.

20. The device according to claim 18, wherein the oscillator stage of the automatic control circuit includes an oscillating circuit connected to a MEMS resonator to provide an oscillating signal so that the oscillator stage provides the reference signal, all electronic components of the automatic control circuit being grouped together to form a single electronic module.

* * * * *